United States Patent
Li et al.

(10) Patent No.: US 10,490,575 B2
(45) Date of Patent: Nov. 26, 2019

(54) ARRAY SUBSTRATE AND DISPLAY DEVICE

(71) Applicant: BOE TECHNOLOGY GROUP CO., LTD., Beijing (CN)

(72) Inventors: Wenbo Li, Beijing (CN); Yanbing Wu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/517,054

(22) PCT Filed: Feb. 18, 2016

(86) PCT No.: PCT/CN2016/074046
§ 371 (c)(1),
(2) Date: Apr. 5, 2017

(87) PCT Pub. No.: WO2017/041441
PCT Pub. Date: Mar. 16, 2017

(65) Prior Publication Data
US 2017/0301703 A1    Oct. 19, 2017

(30) Foreign Application Priority Data
Sep. 9, 2015   (CN) .......................... 2015 1 0572156

(51) Int. Cl.
*H01L 29/04*   (2006.01)
*H01L 27/12*   (2006.01)
(Continued)

(52) U.S. Cl.
CPC ...... *H01L 27/1251* (2013.01); *G02F 1/13624* (2013.01); *G02F 1/133753* (2013.01);
(Continued)

(58) Field of Classification Search
CPC .............. H01L 27/1251; H01L 27/124; H01L 27/1222; H01L 27/1255; H01L 27/1259;
(Continued)

(56) References Cited

U.S. PATENT DOCUMENTS 8,810,761 B2 * 8/2014 Park ................... G02F 1/133707
349/129
2008/0158464 A1 * 7/2008 Chang ................. G02F 1/13624
349/48
(Continued)

FOREIGN PATENT DOCUMENTS

CN    103268043 A    8/2013
CN    103353697 A    10/2013
(Continued)

OTHER PUBLICATIONS

Search Report and Written Opinion dated Jun. 7, 2016 from State Intellectual Property Office of the P.R. China.
Chinese Office Action dated Sep. 7, 2017.

*Primary Examiner* — Shouxiang Hu
(74) *Attorney, Agent, or Firm* — Dilworth & Barrese, LLP.; Michael J. Musella, Esq.

(57) ABSTRACT

An array substrate, a manufacturing method therefor, and a display device are provided. The array substrate comprises multiple pixel units, where at least one of the pixel units comprises a first subpixel electrode and a second subpixel electrode, the first subpixel electrode is electrically connected to a first charging thin-film transistor, and the second subpixel electrode is electrically connected to a second charging thin-film transistor. In same one pixel unit, the charging capacity of the second charging thin-film transistor is greater than the charging capacity of the first charging thin-film transistor.

17 Claims, 3 Drawing Sheets

(51) Int. Cl.
*G02F 1/1337* (2006.01)
*G02F 1/1362* (2006.01)
*G02F 1/1343* (2006.01)

(52) U.S. Cl.
CPC ...... *G02F 1/136213* (2013.01); *H01L 27/124* (2013.01); *H01L 27/1222* (2013.01); *H01L 27/1255* (2013.01); *H01L 27/1259* (2013.01); *G02F 2001/134345* (2013.01)

(58) Field of Classification Search
CPC ..... G02F 1/13624; G02F 2001/134345; G02F 1/136213; G02F 1/133753
See application file for complete search history.

(56) References Cited

U.S. PATENT DOCUMENTS

| | | | |
|---|---|---|---|
| 2010/0014041 A1* | 1/2010 | Park | G02F 1/133707 349/143 |
| 2010/0253869 A1* | 10/2010 | Ting | G02F 1/13624 349/48 |
| 2013/0335688 A1* | 12/2013 | Jung | G02F 1/134336 349/130 |
| 2015/0022507 A1 | 1/2015 | Yao et al. | |
| 2015/0036067 A1 | 2/2015 | Xue et al. | |
| 2015/0364068 A1 | 12/2015 | Yao et al. | |
| 2016/0210924 A1 | 7/2016 | Yao et al. | |
| 2016/0291367 A1 | 10/2016 | Cheng et al. | |
| 2016/0299392 A1 | 10/2016 | Cheng et al. | |

FOREIGN PATENT DOCUMENTS

| | | |
|---|---|---|
| CN | 103389604 A | 11/2013 |
| CN | 103399435 A | 11/2013 |
| CN | 204065625 U | 12/2014 |
| CN | 204065626 U | 12/2014 |
| CN | 204101858 U | 1/2015 |
| CN | 104834142 A | 8/2015 |
| CN | 204758983 U | 11/2015 |
| CN | 105137685 A | 12/2015 |
| JP | 2010128004 A | 6/2010 |
| JP | 2012168228 A | 9/2012 |
| JP | 104865763 A | 8/2015 |

\* cited by examiner

ARRAY SUBSTRATE AND DISPLAY DEVICE

TECHNICAL FIELD

Embodiments of the present disclosure relate to an array substrate and a manufacturing method thereof, and a display device.

BACKGROUND

A liquid crystal display device has characteristics of low power consumption, no radiation and the like, and has occupied a dominant position in the field of flat display at present.

A liquid crystal panel in an existing liquid crystal display device generally includes an array substrate and a color filter substrate which are arranged oppositely, and a liquid crystal layer filled between the array substrate and the color filter substrate, wherein a plurality of pixel units arranged in an array are disposed on the array substrate; pixel electrodes are arranged in the pixel units; corresponding to the pixel electrodes, common electrodes are arranged on the color filter substrate; and by electric fields formed between the pixel electrodes and the common electrodes, deflection of liquid crystal molecules in liquid crystal regions corresponding to the pixel units are controlled so as to achieve a liquid crystal display function.

However, in an existing array substrate, generally each pixel unit is basically same in structure, and the liquid crystal molecules in the liquid crystal region corresponding to the pixel unit are single in deflection angle and have the basically same deflection angle, so that a viewing angle (an angle range allowing a user to observe a normally displayed image) of the existing liquid crystal display device is relatively small.

SUMMARY

Embodiments of the present disclosure provide an array substrate and a manufacturing method thereof, and a display device.

In one aspect, an embodiment of the present disclosure provides an array substrate including a plurality of pixel units, wherein at least one of the pixel units includes a first sub-pixel electrode and a second sub-pixel electrode, the first sub-pixel electrode is electrically connected with a first charging thin film transistor, and the second sub-pixel electrode is electrically connected with a second charging thin film transistor; and in a same pixel unit, charging ability of the second charging thin film transistor is stronger than that of the first charging thin film transistor.

In another aspect, an embodiment of the present disclosure provides a manufacturing method of an array substrate, including: forming a plurality of pixel units, at least one of the pixel units including a first charging thin film transistor, a second charging thin film transistor, a first sub-pixel electrode and a second sub-pixel electrode, wherein the first charging thin film transistor is electrically connected with the first sub-pixel electrode, and the second charging thin film transistor is electrically connected with the second sub-pixel electrode; and in a same pixel unit, a charging ability of the second charging thin film transistor is stronger than that of the first charging thin film transistor.

In yet another aspect, an embodiment of the present disclosure provides a display device, comprising the array substrate according to any of the above technical schemes.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

Figure 1:
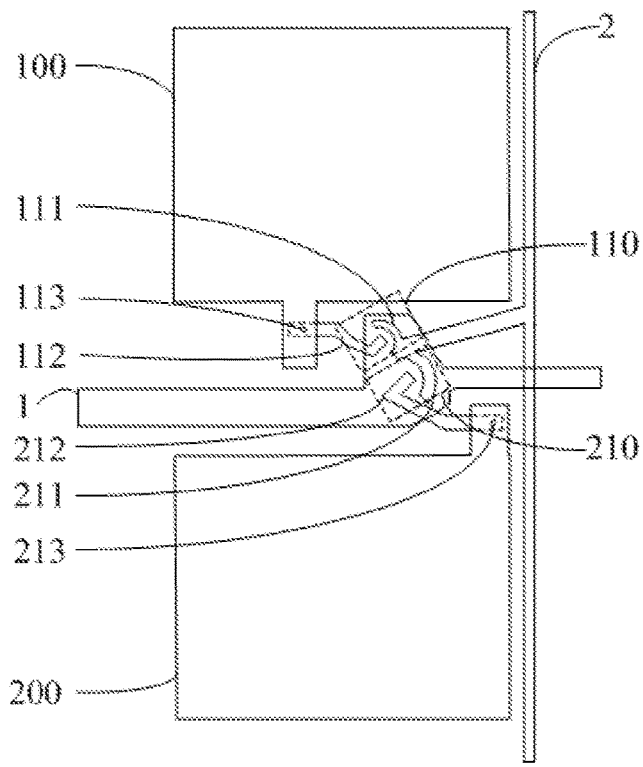
FIG. 1 is a plane schematic diagram of a pixel unit structure on an array substrate provided by Embodiment 1 of the present disclosure.

The technical solution of the embodiments will be described in a clearly and fully understandable way in connection with the drawings related to the embodiments of the disclosure. It is obvious that the described embodiments are just a part but not all of the embodiments of the disclosure. Based on the embodiments of the disclosure, those skilled in the art can obtain other embodiment(s), without any inventive work, which should be within the scope of protection of the disclosure.

In one aspect, an embodiment of the present disclosure provides an array substrate, which includes a plurality of pixel units, wherein at least one of the pixel units includes a first sub-pixel electrode and a second sub-pixel electrode, and correspondingly a first charging thin film transistor and second charging thin film transistor; the first sub-pixel electrode is electrically connected with a charging drain electrode of the first charging thin film transistor, and the second sub-pixel electrode is electrically connected with a charging drain electrode of the second charging thin film transistor; and in the same pixel unit, charging ability of the second charging thin film transistor is stronger than that of the first charging thin film transistor. Exemplarily, the plurality of pixel units is arranged in array.

It should be noted that the charging ability of the charging thin film transistor can be indicated by an amount of a charging current between a source electrode and a drain electrode of the charging thin film transistor when it is in an on state. That is, the stronger the charging ability of the charging thin film transistor is, the greater the charging current of the charging thin film transistor is. In addition, generally speaking, a charged voltage on the pixel electrode is proportional to the charging current of the corresponding charging thin film transistor, i.e., the stronger the charging ability of the charging thin film transistor is, the larger the charged voltage on the corresponding pixel electrode is.

In addition, liquid crystals have anisotropy optically, and thus, a liquid crystal region in which liquid crystal molecules have a same deflection angle (i.e., long axes of the liquid crystal molecules point to a same direction) has different refractive indexes as for incident light from various directions; in other words, if the same light is incident into the liquid crystal region from different directions and emerges from different directions, when an observer observes from different directions, the light entering eyes is different. However, liquid crystal molecules in a liquid crystal region corresponding to a single pixel unit in an existing liquid crystal display device have a same deflection angle (long axes all point to a same direction), and generally, an observer needs to make an observation direction close to the long axis direction of the liquid crystal molecules in the liquid crystal region to enable light constituting a normal image to enter eyes of the observer, resulting in that a viewing angle of the liquid crystal display device is limited in a relatively small range.

In the embodiment of the present disclosure, in the same pixel unit, the charging ability of the second charging thin film transistor is stronger than that of the first charging thin film transistor, and thus, in the charging process of the first sub-pixel electrode and the second sub-pixel electrode, a charged voltage on the first sub-pixel electrode is lower than that on the second sub-pixel electrode; and therefore, when the first sub-pixel electrode and the second sub-pixel electrode discharge, field strength of an electric field formed by the first sub-pixel electrode and a common electrode is lower than that of an electric field formed by the second sub-pixel electrode and the common electrode, so that an electric field force applied to liquid crystal molecules in a liquid crystal domain region corresponding to the first sub-pixel electrode is smaller than that applied to liquid crystal molecules in a liquid crystal domain region corresponding to the second sub-pixel electrode, and then deflection angles of the liquid crystal molecules in the two liquid crystal domain regions are different, i.e., the liquid crystal molecules in the liquid crystal region corresponding to the same pixel unit at least have two different deflection angles (i.e., at least have two different long axis directions), and at the moment, an observer can enable light constituting a normal image to enter eyes thereof by making an observation direction close to any of the long axis directions in the liquid crystal region. Therefore, compared with the prior art in which the liquid crystal molecules in the liquid crystal region corresponding to the single pixel unit only have one deflection angle, the array substrate provided by the embodiment of the present disclosure can obviously enlarge the viewing angle of the liquid crystal display device.

In the embodiment, the charging ability of the second charging thin film transistor in the same pixel unit can be stronger than that of the first charging thin film transistor in the same pixel unit by various setting modes. For example, One of the modes is that: a width-to-length ratio of the first charging thin film transistor is enabled to be less than that of the second charging thin film transistor. The width-to-length ratio is an inherent attribute of any of the thin film transistors and generally, is written as W/L, W and L respectively represent a width and a length of a channel; exemplarily, the width W herein is a longitudinal length of the channel; and the length L herein is a distance from the source electrode to the drain electrode in a cross section of the channel (i.e., a width of the channel in the cross section). When a voltage is applied to a gate electrode to enable an active layer to be conducted, the thin film transistor is in the on state, at the moment, the channel can be equivalent to a resistor, and then the charging current flowing to the drain electrode from the source electrode through the resistor is proportional to the width W and is inversely proportional to the length L, i.e., is proportional to the width-to-length ratio W/L. Therefore, according to the embodiment, by setting the width-to-length ratios W/L of two charging thin film transistors, the charging currents of two charging thin film transistors are regulated, i.e., the charged voltages on the two sub-pixel electrodes are controlled, finally, the deflection angles of the liquid crystal molecules in the liquid crystal domain regions corresponding to two sub-pixel electrodes are controlled, and then the deflection angles of the liquid crystal molecules in two domain regions are different, so that light emerging from two domain regions is different in direction, thereby keeping the light emerging from the liquid crystals uniform integrally in all directions, forming approximately same images and finally improving the viewing angle characteristic of the liquid crystal display device.

It should be noted that when Vds≤Vgs−Vth and Vgs>Vth, the charging current accords with a relational expression below:

$$I_{on} = \frac{1}{2}\mu_n C_{ox} \frac{W}{L}(V_{gs} - V_{th})^2 V_{gs}$$

Vgs represents a potential difference between the gate electrode and the source electrode, and Vth represents an initial excited voltage, i.e., a threshold voltage, of charges for a layer conduction band of the active layer. $C_{ox} = \epsilon_0 \epsilon_{ox}/d_{ox}$, where $C_{ox}$ represents a capacitance of a gate insulating layer in unit area, $\epsilon_0$ represents a vacuum dielectric constant, $\epsilon_{ox}$ represents a dielectric constant of the gate insulating layer, and $d_{ox}$ represents a thickness of the gate insulating layer. $\mu_n$ represents electron mobility of the active layer. It can be known from the relational expression that: the charging current of the thin film transistor is proportional to the width-to-length ratio.

For the embodiment, further, in the same pixel unit according to the embodiment of the present disclosure, the ratio of the width-to-length ratio of the first charging thin film transistor to the width-to-length ratio of the second charging thin film transistor can be in a range of 80% to 90%, and then a range of a voltage difference of the second sub-pixel electrode and the first sub-pixel electrode, which is determined by a difference in the width-to-length ratios, is about 0 to 0.5V. The voltage difference enables the liquid crystal molecules in the liquid crystal domain region corresponding to the first sub-pixel electrode and the liquid crystal molecules in the liquid crystal domain region corresponding to the second sub-pixel electrode to have a corresponding deflection angle difference; and by the above setting, even though the observer enables the observation direction to be positioned between two different long axis directions (i.e., in the middle of a viewing angle range), it can also be guaranteed that the observation direction of the observer is at least closer to one of the long axis directions so as to avoid a deteriorated display effect in the middle of the viewing angle range, thereby guaranteeing the liquid crystal display device to have the excellent display effect in the viewing angle range when increasing the viewing angle of the liquid crystal display device.

It can be understood that in the embodiment of the present disclosure, a different value between the width-to-length ratios of the first charging thin film transistor and the second charging thin film transistor in the same pixel unit is not particularly limited; and a difference value between the charged voltages on the first sub-pixel electrode and the second sub-pixel electrode is also not particularly limited; even though the two difference values are set in other ranges, as long as the excellent display effect of the liquid crystal display device in the viewing angle range can be ensured, they shall fall within the scope of the embodiment of the present disclosure.

Another mode of enabling the charging ability of the second charging thin film transistor to be stronger than that of the first charging thin film transistor in the same pixel unit is that the carrier mobility of the active layer of the first charging thin film transistor is enabled to be less than that of the active layer of the second charging thin film transistor in the same pixel unit.

It should be noted that the active layer can be of a single-layer structure or a multilayer structure, and each layer structure of the single-layer or multilayer structure can be made of one or more materials. Illustration is carried out below by taking the single-layer structure as an example, but is not limited herein.

As described above, when the charging thin film transistor is in the on state, the channel can be equivalent to one resistor, then the charging current is inversely proportional to resistivity of the resistor, but the resistivity is inversely proportional to the carrier mobility, and it can be known from the formula $$I_{on} = \frac{1}{2}\mu_n C_{ox} \frac{W}{L}(V_{gs} - V_{th})^2 V_{gs}$$

that the charging current of the charging thin film transistor is proportional to the mobility $\mu_n$ of the active layer, and thus, the carrier mobility of the active layer of the first charging thin film transistor can be less than that of the active layer of the second charging thin film transistor, so that the charged voltage on the first sub-pixel electrode is lower than that on the second sub-pixel electrode, then the deflection angle of the liquid crystal molecules in the liquid crystal domain region corresponding to the first sub-pixel electrode is less than that of the liquid crystal molecules in the liquid crystal domain region corresponding to the second sub-pixel electrode, i.e., the liquid crystal molecules in the liquid crystal region corresponding to the same pixel unit have different deflection angles, and finally, the viewing angle of the liquid crystal display device is increased.

It should be noted that a material of the active layer of the charging thin film transistor can be selected from an organic material, amorphous silicon a-Si, oxide, low temperature poly silicon LTPS or high temperature poly silicon HTPS, and the like. In general, a sequence of the carrier mobility of the active layer from high to low is organic material and amorphous silicon a-Si, oxide, low temperature poly silicon LTPS or high temperature poly silicon HTPS. It should be understood that in actual production, for the active layers of different charging thin film transistors, different raw materials need to be correspondingly used and patterning processes of the active layers need to be respectively implemented. The patterning processes include, but are not limited to, irradiation, printing, ink jet printing and the like.

No matter which mode is adopted to implement arrangement of two charging thin film transistors different in charging ability in the same pixel unit, the structure of the first charging thin film transistor or the second charging thin film transistor can be the same, and they respectively further includes a charging gate electrode electrically connected with a gate line, and a charging source electrode electrically connected with a data line. It should be noted that in the embodiment of the present disclosure, an electrical connection relationship and a shape type of the charging thin film transistors are not specially limited, and for example, the electrical connection relationship of the two charging thin film transistors can be that the charging source electrode of the first charging thin film transistor and the charging source electrode of the second charging thin film transistor are arranged back to back and electrically connected; and the corresponding charging drain electrodes are positioned on two opposite sides of the two charging source electrodes electrically connected; or the charging source electrode of the first charging thin film transistor and the charging source electrode of the second charging thin film transistor are arranged side by side and are electrically connected, and the two corresponding charging drain electrodes are positioned on the same side of two charging source electrodes; the first charging thin film transistor or the second charging thin film transistor can be a I-type thin film transistor in which the charging source electrode is of a strip shape, and also can be a U-type thin film transistor in which the charging source electrode is of a U shape. Those skilled in the art can adopt the most suitable electrical connection relationship and shape type of the charging thin film transistors according to practical situation, and set the width-to-length ratio of the charging thin film transistors according to the electrical connection relationship and the shape type.

As an improvement on the above-mentioned embodiment, the pixel unit further includes a voltage dividing thin film transistor, a voltage dropping storage capacitor and a common electrode line; the voltage dividing thin film transistor includes a voltage dividing gate electrode, a voltage dividing source electrode and a voltage dividing drain electrode, and the voltage dividing source electrode is electrically connected with the first sub-pixel electrode, wherein the voltage dividing drain electrode and the common electrode line constitute the voltage dropping storage capacitor. Exemplarily, the voltage dividing gate electrode is connected with the gate line, the voltage dividing source electrode and the voltage dividing drain electrode are arranged correspondingly to the voltage dividing gate electrode, so that a channel between the voltage dividing source electrode and the voltage dividing drain electrode is positioned above the voltage dividing gate electrode, and a projection of the voltage dividing drain electrode on a plane where the common electrode line is positioned is partially overlapped with the common electrode line, so that the voltage dropping storage capacitor is formed. When the sub-pixel electrodes are charged, the voltage dividing thin film transistor is in an on state; and thus, when the first sub-pixel electrode is charged, the voltage dropping storage capacitor is charged by the voltage dividing thin film transistor; and when the two sub-pixel electrodes are discharged, the voltage dividing thin film transistor is in an off state, and the voltage dropping storage capacitor cannot discharge to the first sub-pixel electrode. Therefore, by arranging the voltage dividing thin film transistor and the voltage dropping storage capacitor, a part of charged voltage is divided from the first sub-pixel electrode, and then the charged voltage on the first sub-pixel electrode is reduced, so that the difference value between the charged voltages on the second sub-pixel electrode and the first sub-pixel electrode is further increased, thereby further increasing a difference value between the deflection angles of the liquid crystal molecules in the liquid crystal domain region corresponding to the second sub-pixel electrode and in the liquid crystal domain region corresponding to the first sub-pixel electrode and finally enabling the liquid crystal display device to have a larger viewing angle.

As a further improvement on the improvement solution of the above-mentioned embodiment, the pixel unit further includes a voltage dividing storage capacitor, and the voltage dividing drain electrode and the second sub-pixel electrode are configured to be two electrodes of the voltage dividing storage capacitor. Exemplarily, the voltage dividing drain electrode can extend towards a direction of the second sub-pixel electrode or the second sub-pixel electrode can extend towards a direction of the voltage dividing drain electrode, so that projections of the second sub-pixel electrode and the voltage dividing drain electrode on a plane of a substrate have an overlapping portion so as to form the voltage dividing storage capacitor. By the arrangement, in the discharging process, the part of the charged voltage divided from the first sub-pixel electrode by the voltage dividing thin film transistor is supplemented to the second sub-pixel electrode, so that the second sub-pixel electrode can be kept having the relatively high charged voltage for long time, thereby more stably keeping the deflection angle of the liquid crystal molecules in the liquid crystal domain region corresponding to the second sub-pixel electrode and finally obtaining a better viewing angle characteristic.

Structurally, projection positions of the voltage dividing storage capacitor and the voltage dropping storage capacitor on a same plane at least partially overlap with each other; That is, the voltage dividing drain electrode is positioned between the common electrode line and the second sub-pixel electrode, the voltage dividing drain electrode, the common electrode line and the second sub-pixel electrode have a certain overlapped region in a direction perpendicular to the plane of the array substrate.

Exemplarily, the voltage dividing drain electrode and the second sub-pixel electrode can extend towards the direction of the common electrode line, extending portions of the voltage dividing drain electrode and the second sub-pixel electrode overlap right above the common electrode line, the extending portion of the voltage dividing drain electrode is positioned between the common electrode line and the second sub-pixel electrode, so that at the overlapped position, the voltage dividing drain electrode and the common electrode line form the voltage dividing storage capacitor, and the voltage dividing drain electrode and the second sub-pixel electrode form the voltage dropping storage capacitor, so that a total area of lines on the array substrate is reduced, patterning processes of a source and drain metal layer and a gate metal layer are simplified, production efficiency of the array substrate is improved, and an aperture ratio of the array substrate is improved, thereby improving brightness of the liquid crystal display device under the same backlight and finally obtaining a better visual effect.

In the embodiment of the present disclosure, the charging gate electrode of the first charging thin film transistor or the second charging thin film transistor is electrically connected with the gate line, and the charging source electrode of the first charging thin film transistor or the second charging thin film transistor is electrically connected with the data line, and thus, in order to simplify connecting lines between devices on the array substrate to as much as possible, for the embodiment of the present disclosure and the improved solutions thereof, the following arrangement can be carried out: the first sub-pixel electrode and the second sub-pixel electrode are positioned on both sides of the gate line, or the first sub-pixel electrode and the second sub-pixel electrode are positioned on both sides of the data line. By the arrangement, both the first sub-pixel electrode and the second sub-pixel electrode are provided to be as close as possible to the gate line or the data line, so that the circuit area which is necessary to implement the above-mentioned electrical connection is reduced. Therefore, not only can the patterning processes be simplified, but also the aperture ratio of the array substrate can be improved, so that brightness of the liquid crystal display device is improved, and a user obtains a better visual effect.

It should be noted that the above-mentioned implementation mode aims to provide an arrangement concept of the devices of the substrate, the embodiment of the present disclosure does not specially limit positions and electrical connecting modes of the devices such as the first sub-pixel electrode, the second sub-pixel electrode, the first charging thin film transistor, the second charging thin film transistor and the like, and those skilled in the art can adopt the most reasonable arrangement mode according to a practical situation.

For all the above-mentioned embodiments and the improved solutions thereof, a plurality of first sub-pixel electrodes driven by the first charging thin film transistors and/or a plurality of second sub-pixel electrodes driven by the second charging thin film transistors also can be arranged in the same pixel unit; and in the same pixel unit, the first charging thin film transistors and the second charging thin film transistors are respectively different in amount of the charging current. Moreover, the voltage dividing thin film transistors and the voltage dropping storage capacitors can be correspondingly arranged, and for example, in the same pixel unit, corresponding to each first sub-pixel electrode, a voltage dividing thin film transistor and a voltage dropping storage capacitor are arranged, and the voltage dividing thin film transistor includes: the voltage dividing gate electrode electrically connected with the gate line, the voltage dividing source electrode electrically connected with the corresponding first sub-pixel electrode, and the voltage dividing drain electrode. The voltage dividing drain electrode and the common electrode line are configured to be two electrodes of the voltage dropping storage capacitor. By the arrangement, the difference value between the charged voltages on the second sub-pixel electrodes and the first sub-pixel electrodes is increased, so that in a liquid crystal domain region corresponding to the same pixel unit, the difference value of the deflection angles of the liquid crystal molecules in the liquid crystal domain regions corresponding to the second sub-pixel electrodes and in the liquid crystal domain regions corresponding to the first sub-pixel electrodes is enlarged and kept, and finally, the liquid crystal display device has a larger viewing angle.

Further, corresponding to at least one voltage dividing thin film transistor, the voltage dividing storage capacitor also can be arranged, and the voltage dividing drain electrode and any of the second sub-pixel electrodes are configured to be two electrodes of the voltage dividing storage capacitor. By the voltage dividing storage capacitor, the part of the charged voltage divided from the corresponding first sub-pixel electrode by the voltage dividing thin film transistor is supplemented to the second sub-pixel electrode, so that the charged voltage on the second sub-pixel electrode is higher, thereby increasing the voltage difference value between the second sub-pixel electrode and the first sub-pixel electrode, and finally enabling the liquid crystal display device to have a larger viewing angle.

It should be noted that for a case that the same pixel unit includes a plurality of first sub-pixel electrodes and/or a plurality of second sub-pixel electrode, the embodiment of the present disclosure does not specially limit an electrical connecting mode for the voltage dividing thin film transistor and the voltage dividing storage capacitor. For example, according to a sequence of the charging abilities of the charging thin film transistors corresponding to the sub-pixel electrodes from high to low, every two sub-pixel electrodes form one group; in each group, the sub-pixel electrode corresponding to the charging thin film transistor with relatively weak charging ability is taken as the first sub-pixel electrode and the sub-pixel electrode corresponding to the charging thin film transistor with relatively high charging ability is taken as the second sub-pixel electrode; and the first sub-pixel electrode and the second sub-pixel electrode in each group are electrically connected by the voltage dividing thin film transistor and the voltage dividing storage capacitor. Besides, the sub-pixel electrode corresponding to the charging thin film transistor with the weakest charging ability also can be taken as the first sub-pixel electrode, the rest of sub-pixel electrodes are taken as the second sub-pixel electrodes; and the first sub-pixel electrode is electrically connected with the respective second sub-pixel electrodes by the voltage dividing thin film transistors and the voltage dividing storage capacitors respectively. It should be noted that in either of the above-mentioned electrical connecting modes, both arrangement and an electrical connecting mode of the voltage dividing thin film transistor and the voltage dividing storage capacitor are the same with those in the above-mentioned technical solutions, i.e., the source electrode of the voltage dividing thin film transistor is electrically connected with the sub-pixel electrode with the relatively small charging current, and the drain electrode of the voltage dividing thin film transistor and the common electrode line constitute the voltage dropping storage capacitor. Those skilled in the art can freely set the arrangement mode of the voltage dividing thin film transistor and the voltage dividing storage capacitor, as long as a charged voltage portion can be divided from the sub-pixel electrode corresponding to the charging thin film transistor with relatively weak charging ability to the sub-pixel electrode corresponding to the charging thin film transistor with relatively high charging ability, so as to fulfill the aim of enlarging and keeping the difference value between the charged voltages on the sub-pixel electrode with the relatively low charged voltage and the sub-pixel electrode with the relatively high charged voltage.

In a further improved solution, the following arrangement can be adopted: the stronger the charging ability of the voltage dividing thin film transistor is, the lower the charging ability of the first charging thin film transistor corresponding to the corresponding first sub-pixel electrode is, so that the lower the charged voltage on the sub-pixel electrode is, the higher the charged voltage portion divided from the sub-pixel electrode by the voltage dividing thin film transistor is, thereby further increasing the voltage difference value between the first sub-pixel electrode and the second sub-pixel electrode and finally increasing the viewing angle of the liquid crystal display device better.

An embodiment of the present disclosure further provides a manufacturing method of an array substrate, including: forming a first charging thin film transistor and a second charging thin film transistor; and forming a plurality of pixel units, at least one pixel unit including a first sub-pixel electrode and a second sub-pixel electrode, wherein the first charging thin film transistor is electrically connected with the first sub-pixel electrode, and the second charging thin film transistor is electrically connected with the second sub-pixel electrode; and in the same pixel unit, a charging current of the first charging thin film transistor is smaller than that of the second charging thin film transistor.

The embodiment of the present disclosure provides the manufacturing method of the array substrate. A plurality of pixel units are arranged on the array substrate manufactured by the manufacturing method of the array substrate, the first sub-pixel electrode driven by the first charging thin film transistor and the second sub-pixel electrode driven by the second charging thin film transistor are arranged in at least one pixel unit, and charging ability of the second charging thin film transistor is stronger than that of the first charging thin film transistor. In this way, a charged voltage on the first sub-pixel electrode in the same pixel unit is lower than that on the second sub-pixel electrode in the same pixel unit, then an electric field generated between the first sub-pixel electrode and a common electrode is weaker than that generated between the second sub-pixel electrode and the common electrode, and the electric fields different in magnitude further enable a deflection angle of liquid crystal molecules in a liquid crystal region corresponding to the first sub-pixel electrode to be less than that of liquid crystal molecules in a liquid crystal region corresponding to the second sub-pixel electrode, i.e., the liquid crystal molecules in the liquid crystal regions corresponding to the same pixel unit have at least two deflection angles, and thus, compared to the prior art in which liquid crystal molecules in liquid crystal regions corresponding to one single pixel unit only have one deflection angle, the embodiment of the present disclosure can obviously increase a viewing angle of a liquid crystal display device.

Further, the forming the first charging thin film transistor and the second charging thin film transistor can includes:

Forming a gate metal layer on a base substrate, the gate metal layer including a gate line, a charging gate electrode of the first charging thin film transistor and a charging gate electrode of the second charging thin film transistor; forming a gate insulating layer on the base substrate on which the gate metal layer is formed; forming an active layer on the base substrate on which the gate insulating layer is formed, the active layer including an active layer of the first charging thin film transistor and an active layer of the second charging thin film transistor; and forming a source and drain metal layer on the base substrate on which the active layer is formed, the source and drain metal layer including a charging source electrode and a charging drain electrode of the first charging thin film transistor, and a charging source electrode and a charging drain electrode of the second charging thin film transistor.

The manufacturing method of the array substrate further can include: forming a passivation layer on the base substrate on which the source and drain metal layer is formed.

Exemplarily, the forming a plurality of pixel units can include: forming a pixel electrode layer on the base substrate on which the passivation layer is formed, the pixel electrode layer including the first sub-pixel electrode and the second sub-pixel electrode.

In this way, in each functional layer (including the gate metal layer, the gate insulating layer, the active layer, the source and drain metal layer, the passivation layer and the pixel electrode layer) on the base substrate, the components, e.g., a signal line, the source electrode, the drain electrode and the gate electrode of the charging thin film transistor, the pixel electrode and the like, are respectively formed so as to complete manufacturing of the array substrate.

Optionally, when materials of the active layers of the first charging thin film transistor and the second charging thin film transistor are different, a patterning process of the active layers can be simplified to a certain degree, and for example:

The material of the active layer of the first charging thin film transistor is amorphous silicon a-Si, the material of the active layer of the second charging thin film transistor is low temperature poly silicon LTPS or high temperature poly silicon HTPS, and the forming the active layer on the base substrate on which the gate insulating layer is formed can include: forming, by using amorphous silicon a-Si as a raw material, the active layer on the base substrate on which the gate insulating layer is formed, and carrying out the patterning process of the active layer to form pre-structures of the active layer of the first charging thin film transistor, which is made of amorphous silicon a-Si, and the active layer of the second charging thin film transistor, which is made of the a-Si; and carrying out an ion implantation process on the pre-structure of the active layer of the second charging thin film transistor to crystallize amorphous silicon a-Si into low temperature poly silicon LTPS or high temperature poly silicon HTPS so as to form the active layer of the second charging thin film transistor. Because the basic raw materials of amorphous silicon a-Si, low temperature poly silicon LTPS and high temperature poly silicon HTPS are similar (main body materials are all silicon Si), when the patterning process of the active layer is carried out in such way, the active layer of the first charging thin film transistor and the active layer of the second charging thin film transistor can be obtained only by carrying out the patterning process, and compared to the prior art in which an active layer of a first charging thin film transistor and an active layer of a second charging thin film transistor are respectively formed by carrying out two patterning processes, the embodiment of the present disclosure reduces one patterning process, so that the manufacturing method of the array substrate is simplified, and manufacturing cost is reduced.

An embodiment of the present disclosure further provides a display device, including the array substrate according to any one embodiment described above.

A plurality of pixel units are arranged on the array substrate in the display device provided by the embodiment of the present disclosure, a first sub-pixel electrode driven by a first charging thin film transistor and a second sub-pixel electrode driven by a second charging thin film transistor are arranged in at least one pixel unit, and the charging ability of the second charging thin film transistor is stronger than that of the first charging thin film transistor. In this way, a charged voltage on the first sub-pixel electrode in the same pixel unit is lower than that on the second sub-pixel electrode in the same pixel unit, then an electric field generated between the first sub-pixel electrode and a common electrode is weaker than that generated between the second sub-pixel electrode and the common electrode, and the electric fields different in magnitude further enable a deflection angle of liquid crystal molecules in a liquid crystal region corresponding to the first sub-pixel electrode to be less than that of liquid crystal molecules in a liquid crystal region corresponding to the second sub-pixel electrode, i.e., the liquid crystal molecules in the liquid crystal regions corresponding to the same pixel unit have at least two deflection angles, and thus, compared to the prior art in which the liquid crystal molecules in the liquid crystal regions corresponding to one single pixel unit only have one deflection angle, the liquid crystal display device provided by the embodiment of the present disclosure can provide a relatively large viewing angle.

It should be noted that the array substrate included in the display device provided by the embodiment of the present disclosure is not limited to any one of the above-mentioned embodiments, and those skilled in the art can combine or change any of the above-mentioned embodiments according to practical situations so as to manufacture the liquid crystal display device which has an excellent viewing angle characteristic and is suitable to produce and use.

The array substrate and the display device according to the embodiments of the present disclosure will be exemplarily described below in connection with the drawings.

Embodiment 1

As shown in FIG. 1, a pixel unit includes a first sub-pixel electrode 100, a second sub-pixel electrode 200, a first charging thin film transistor 110 and a second charging thin film transistor 210. The first charging thin film transistor 110 includes a charging source electrode 111, a charging drain electrode 112 and a charging gate electrode (the charging gate electrode corresponds to a channel between the charging source electrode 111 and the charging drain electrode 112 in FIG. 1, the charging gate electrode is located below the source and drain metal layer where the source electrode 111 and the drain electrode 112 are located, and is electrically connected with a gate line 1, which is not shown), and the second charging thin film transistor 210 includes a charging source electrode 211, a charging drain electrode 212 and a charging gate electrode (the charging gate electrode is electrically connected with the gate line 1, but it is not shown that the charging gate electrode is located below a channel between the charging source electrode 211 and the charging drain electrode 212, and is located below the source and drain metal layer where the source electrode 211 and the drain electrode 212 are located, which is not shown). The first sub-pixel electrode 100 and the second sub-pixel electrode 200 can be respectively positioned on both sides of one gate line 1, and/or on a same side of one data line 2; the charging source electrodes 111 and 211 are arranged between the first sub-pixel electrode 100 and the second sub-pixel electrode 200, and are electrically connected with the data line, respectively; a channel is formed between the charging source electrode 111 and the charging drain electrode 112, the charging drain electrode 112 is electrically connected with the first sub-pixel electrode 100 through a via hole 113, and the charging drain electrode 212 is electrically connected with the second sub-pixel electrode 200 through a via hole 213; and a width-to-length ratio of the first charging thin film transistor 110 is less than that of the second charging thin film transistor 210.

It should be noted that in the embodiment, that the first charging thin film transistor 110 and the second charging thin film transistor 210 share the same gate line 1 and data line 2 is taken as an example. However, the first charging thin film transistor 110 and the second charging thin film transistor 210 also can correspond to different gate lines or data lines, respectively.

In the embodiment, the width-to-length ratio of the first charging thin film transistor 110 to be less than that of the second charging thin film transistor 210 enables charging ability of the second charging thin film transistor 210 to be stronger than that of the first charging thin film transistor 110, i.e., enabling a charged voltage on the second sub-pixel electrode 200 to be higher than that on the first sub-pixel electrode 100. Therefore, in the same pixel unit, a deflection angle of liquid crystal molecules in a liquid crystal region corresponding to the first sub-pixel electrode 100 is less than that of liquid crystal molecules in a liquid crystal region corresponding to the second sub-pixel electrode 200, so that the deflection angles of the liquid crystal molecules in the liquid crystal regions corresponding to the same pixel unit are different, thereby enabling a liquid crystal display device to have a larger display viewing angle.

Exemplarily, it has been described above that the width-to-length ratios of the first charging thin film transistor 110 and the second charging thin film transistor 210 are determined by lengths and cross section widths of the respective channels of the first charging thin film transistor 110 and the second charging thin film transistor 210, and thus, by setting lengths and shapes of the charging source electrodes 111 and 211 and lengths and shapes of the charging drain electrodes 211 and 212, the width-to-length ratios of the first charging thin film transistor 110 and the second charging thin film transistor 210 can be arbitrarily set.

Moreover, exemplarily, the pixel unit can be arranged by taking the gate line 1 can be taken as a center line, and the channel between the charging source electrode 111 and the charging drain electrode 112 in the first charging thin film transistor 110 and the channel between the charging source electrode 211 and the charging drain electrode 212 in the second charging thin film transistor 210 are positioned right above the gate line 1, so that the gate line 1 is directly taken as the gate electrode of the first charging thin film transistor 110 and the gate electrode of the second charging thin film transistor 210, thereby reducing a total area of lines (e.g., a line for electrically connecting the gate electrodes and the gate line 1, a line for electrically connecting the charging source electrodes 111 and 211 and the data line 2, a line for electrically connecting the first sub-pixel electrode 100 and the charging drain electrode 112, a line for electrically connecting the second sub-pixel electrode 200 and the charging drain electrode 212 and the like) on the array substrate, simplifying a patterning process of each functional layer on a base substrate, further improving an aperture ratio of the array substrate and enabling the liquid crystal display device to have a better display effect.

Embodiment 2

Figure 2:
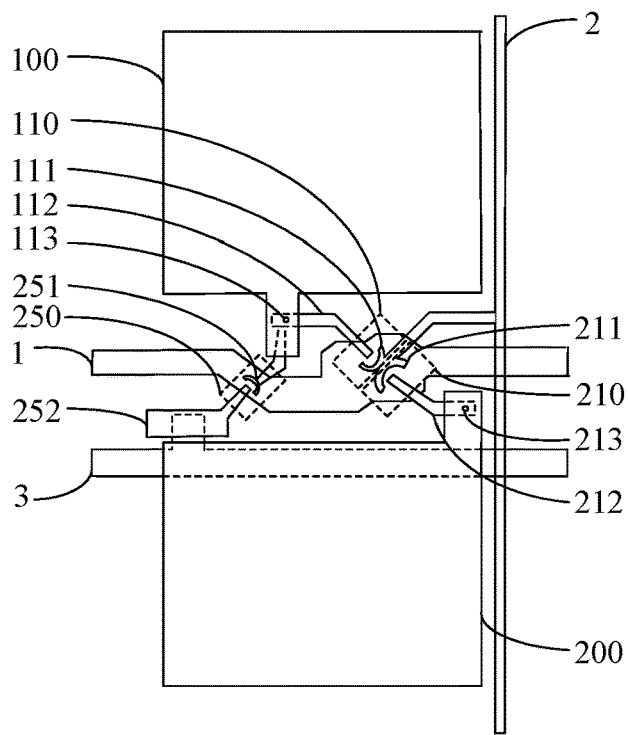
FIG. 2 is a plane schematic diagram of a pixel unit structure on an array substrate provided by Embodiment 2 of the present disclosure.

As shown in FIG. 2, in the embodiment, a voltage dividing thin film transistor 250 is further included in the same pixel unit. The voltage dividing thin film transistor 250 includes a voltage dividing source electrode 251, a voltage dividing drain electrode 252 and a voltage dividing gate electrode. The voltage dividing source electrode 251 is electrically connected with the first sub-pixel electrode 100, the voltage dividing drain electrode 252 is formed correspondingly to the voltage dividing source electrode 251, a channel is formed between the voltage dividing source electrode 251 and the voltage dividing drain electrode 252, and the voltage dividing drain electrode 252 extends to a position right above a common electrode line 3 and forms a voltage dropping storage capacitor with the common electrode line 3. In the embodiment of the present disclosure, an exemplary arrangement of the voltage dividing thin film transistor 250 and the voltage dropping storage capacitor is provided, but the embodiment of the present disclosure is not limited thereto, and those skilled in the art can arrange the voltage dividing thin film transistor and the voltage dropping storage capacitor according to a practical situation.

Embodiment 3

Figure 3:
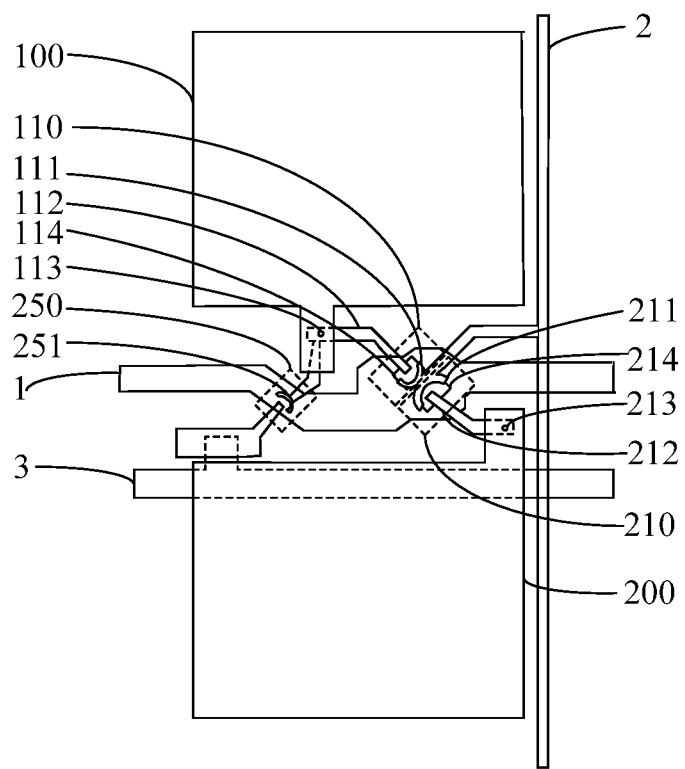
FIG. 3 is a plane schematic diagram of a pixel unit structure on an array substrate provided by Embodiment 3 of the present disclosure

As shown in FIG. 3, it has been described above that a magnitude of a charging current of the thin film transistor is proportional to a width-to-length ratio and/or carrier mobility of the active layer. Thus, in the embodiment, by enabling the carrier mobility of a material of an active layer 114 in the first charging thin film transistor 110 to be less than that of a material of an active layer 214 in the second charging thin film transistor 210, a charging ability of the second charging thin film transistor is further stronger than that of the first charging thin film transistor 210, so that a charged voltage on the first sub-pixel electrode 100 is lower than that on the second sub-pixel electrode 200. Therefore, the deflection angles of the liquid crystal molecules in the liquid crystal regions corresponding to the same pixel unit are different, and finally, the viewing angle of the liquid crystal display device is enlarged.

Embodiment 4

Figure 4:
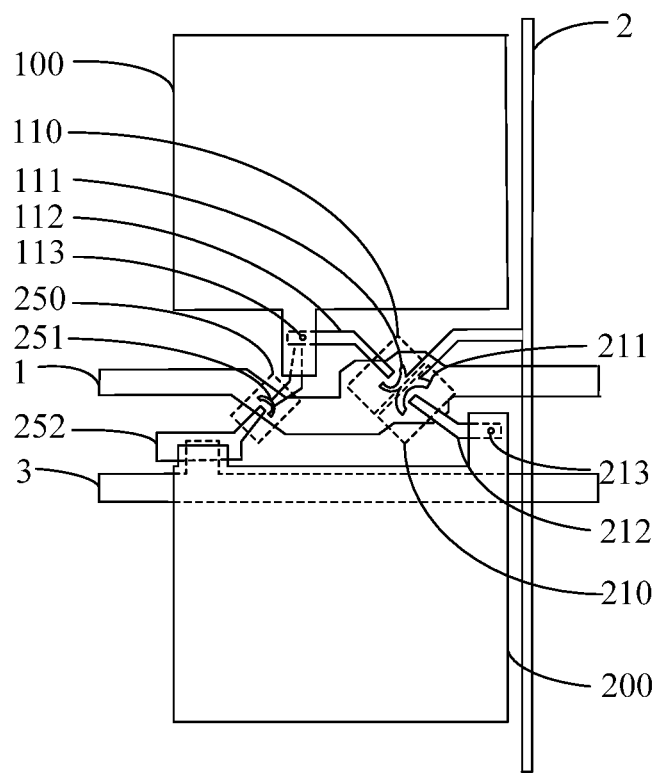
FIG. 4 is a plane schematic diagram of a pixel unit structure on an array substrate provided by Embodiment 4 of the present disclosure.

As shown in FIG. 4, in the embodiment, the pixel unit further includes a voltage dividing storage capacitor. For example, the voltage dividing drain electrode 252 and the second sub-pixel electrode 200 are configured to be two electrodes of the voltage dividing storage capacitor. By arranging the voltage dividing storage capacitor, in the discharging process, a part of the charged voltage divided from the first sub-pixel electrode 100 by the voltage dividing thin film transistor is supplemented to the second sub-pixel electrode 200, so that the second sub-pixel electrode 200 can be kept having the relatively high charged voltage for long time, thereby more stably keeping the deflection angle of the liquid crystal molecules in a liquid crystal domain region corresponding to the second sub-pixel electrode 200 and finally enabling the liquid crystal display device to have a larger viewing angle.

Embodiment 5

Figure 5:
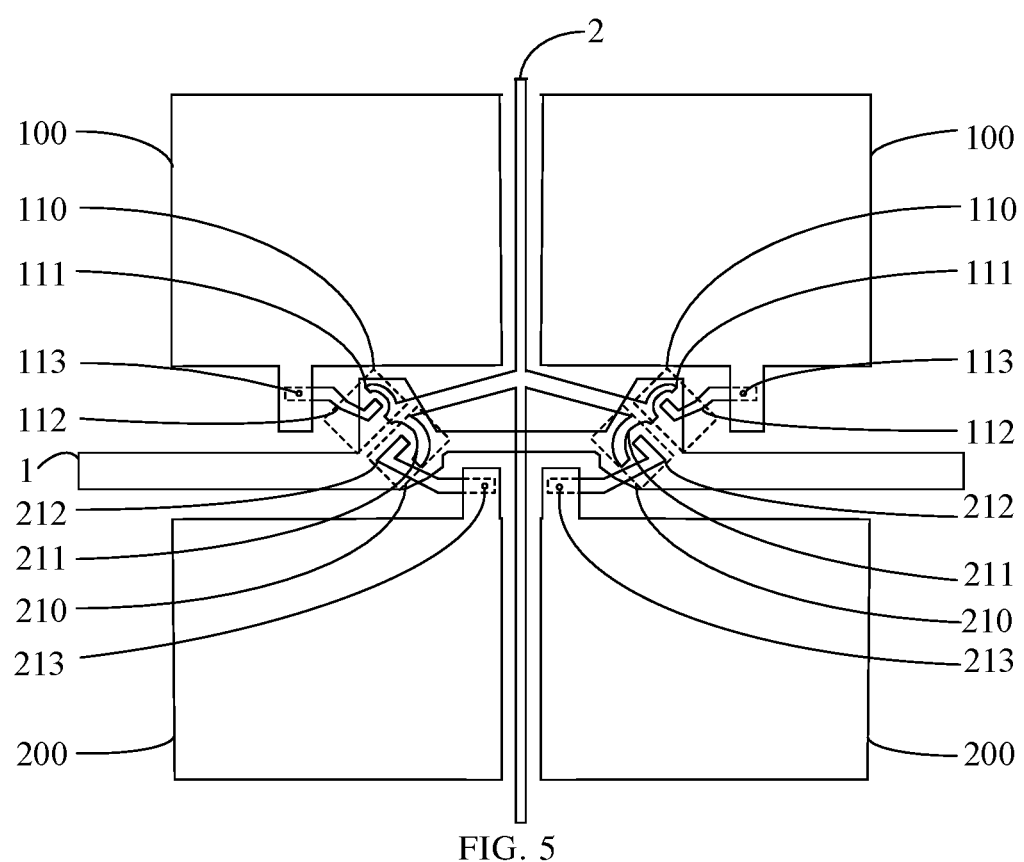
FIG. 5 is a plane schematic diagram of a pixel unit structure on an array substrate provided by Embodiment 5 of the present disclosure.

As shown in FIG. 5, exemplarily, the gate line 1 and the data line 2 define one pixel unit; the pixel unit includes two first sub-pixel electrodes 100 and respectively corresponding first charging thin film transistors 110, and two second sub-pixel electrodes 200 and respectively corresponding second charging thin film transistors 210. The first charging thin film transistors 110 includes the charging source electrode 111, the charging drain electrode 112, and the second charging thin film transistor includes the charging source electrode 211 and the charging drain electrode 212. Two first sub-pixel electrodes 100 and two second sub-pixel electrodes 200 are respectively positioned in four quadrants defined by the gate line 1 and the data line 2; the charging source electrodes 111 are positioned between the first sub-pixel electrodes 100 and the second sub-pixel electrodes 200, the charging source electrodes 111 and 211 are electrically connected with the data line 2; the two charging drain electrodes 112 are respectively connected with the corresponding first sub-pixel electrodes 100, and the two charging drain electrodes 212 are respectively connected with the corresponding second sub-pixel electrodes 200. The two first charging thin film transistors 110 are different in charging ability, the two second charging thin film transistors 210 are different in charging ability, and the charging ability of the second charging thin film transistor 210 is stronger than that of the first charging thin film transistor 110. By such arrangement, in the same pixel unit, the charged voltages on two first sub-pixel electrodes 100 and two second sub-pixel electrodes 200 are respectively different in magnitude, so that liquid crystal molecules in liquid crystal regions corresponding to the same pixel unit have four different deflection angles, thereby further increasing a viewing angle of a liquid crystal display device.

The embodiments of the present disclosure provide the array substrate and the manufacturing method thereof, and the display device. A plurality of pixel units are arranged on the array substrate, the first sub-pixel electrode driven by the first charging thin film transistor and the second sub-pixel electrode driven by the second charging thin film transistor are arranged in at least one pixel unit, and in the same pixel unit, the charging ability of the second charging thin film transistor is stronger than that of the first charging thin film transistor. In this way, the charged voltage on the first sub-pixel electrode in the same pixel unit is lower than that on the second sub-pixel electrode in the same pixel unit, then an electric field generated between the first sub-pixel electrode and the common electrode is weaker than that generated between the second sub-pixel electrode and the common electrode, and the electric fields different in magnitude further enable the deflection angle of the liquid crystal molecules in the liquid crystal region corresponding to the first sub-pixel electrode to be less than that of the liquid crystal molecules in the liquid crystal region corresponding to the second sub-pixel electrode, i.e., the liquid crystal molecules in the liquid crystal regions corresponding to the same pixel unit have at least two deflection angles, and thus, compared to the prior art in which the liquid crystal regions corresponding to one single pixel unit only have one deflection angle, the embodiments of the present disclosure can obviously increase the viewing angle of the liquid crystal display device.

Obviously, the foregoing embodiments merely are examples for clearly illustrating, but not intended to define the embodiments. Those skilled in the art also can make other different forms of variations or changes on the basis of the illustration above. All embodiments do not need to, and also cannot, be exhausted herein. The apparent variations or changes made on the basis of the embodiments of the present disclosure are still within the scope of the present disclosure.

The present application claims priority of the Chinese Patent Application No. 201510572156.1 filed on Sep. 9, 2015, the disclosure of which are incorporated herein by its reference in its entirety as part of the present application.

The invention claimed is:

1. An array substrate, comprising a plurality of pixel units defined by gate lines and data lines, each of the pixel units including four quadrants defined by the gate line and the data line, wherein
at least one of the pixel units includes two first sub-pixel electrodes and two second sub-pixel electrodes respectively located in the four quadrants, each of the two first sub-pixel electrodes is electrically connected with a corresponding first charging thin film transistor, and each of the two second sub-pixel electrodes is electrically connected with a corresponding second charging thin film transistor; and
in the pixel unit, charging abilities of the two first charging thin film transistors corresponding to the two first sub-pixel electrodes are different, charging abilities of the two second charging thin film transistors corresponding to the two second sub-pixel electrodes are different, and the charging ability of each of the second charging thin film transistors is stronger than that of each of the first charging thin film transistors,
wherein in the pixel unit, a width-to-length ratio of each of the first charging thin film transistors is less than that of each of the second charging thin film transistors.

2. The array substrate according to claim 1, wherein in the same pixel unit, carrier mobility of an active layer of each of the first charging thin film transistors is less than that of an active layer of each of the second charging thin film transistors.

3. The array substrate according to claim 2, wherein the pixel unit further includes a voltage dividing thin film transistor, a voltage dropping storage capacitor and a common electrode line, the voltage dividing thin film transistor includes a voltage dividing gate electrode, a voltage dividing source electrode and a voltage dividing drain electrode, and the voltage dividing source electrode is electrically connected with a corresponding one of the first sub-pixel electrodes, wherein the voltage dividing drain electrode and the common electrode line are configured to be two electrodes of the voltage dropping storage capacitor.

4. The array substrate according to claim 2, wherein in the pixel unit, one of the first sub-pixel electrodes and one of the second sub-pixel electrodes are positioned on both sides of the gate line, or one of the first sub-pixel electrodes and one of the second sub-pixel electrodes are positioned on both sides of the data line.

5. The array substrate according to claim 1, wherein in the pixel unit, one of the first sub-pixel electrodes and one of the second sub-pixel electrodes are positioned on both sides of the gate line, or one of the first sub-pixel electrodes and one of the second sub-pixel electrodes are positioned on both sides of the data line.

6. The array substrate according to claim 1, wherein in the pixel unit, a charged voltage on one of the first sub-pixel electrodes is lower than that on one of the second sub-pixel electrodes.

7. The array substrate according to claim 1, wherein in the pixel unit, a charging current of the first charging thin film transistors is less than that of the second charging thin film transistors.

8. A display device, comprising the array substrate according to claim 1.

9. The array substrate according to claim 1, wherein the pixel unit further includes a voltage dividing thin film transistor, a voltage dropping storage capacitor and a common electrode line, the voltage dividing thin film transistor includes a voltage dividing gate electrode, a voltage dividing source electrode and a voltage dividing drain electrode, and the voltage dividing source electrode is electrically connected with a corresponding one of the first sub-pixel electrodes, wherein the voltage dividing drain electrode and the common electrode line are configured to be two electrodes of the voltage dropping storage capacitor.

10. The array substrate according to claim 1, wherein a charging source electrode of a corresponding one of the first charging thin film transistors and a charging source electrode of a corresponding one of the second charging thin film transistors are electrically connected.

11. An array substrate, comprising a plurality of pixel units defined by gate lines and data lines, each of the pixel units including four quadrants defined by the gate line and the data line, wherein
at least one of the pixel units includes two first sub-pixel electrodes and two second sub-pixel electrodes respectively located in the four quadrants, each of the two first sub-pixel electrodes is electrically connected with a corresponding first charging thin film transistor, and each of the two second sub-pixel electrodes is electrically connected with a corresponding second charging thin film transistor; and
in the pixel unit, charging abilities of two first charging thin film transistors corresponding to the two first sub-pixel electrodes are different, charging abilities of two second charging thin film transistors corresponding to the two second sub-pixel electrodes are different, and the charging ability of each of the second charging thin film transistors is stronger than that of each of the first charging thin film transistors, wherein in the pixel unit, an width-to-length ratio of each of the first charging thin film transistors is less than that of each of the second charging thin film transistors, wherein the pixel unit further includes a voltage dividing thin film transistor, a voltage dropping storage capacitor and a common electrode line, the voltage dividing thin film transistor includes a voltage dividing gate electrode, a voltage dividing source electrode and a voltage dividing drain electrode, and the voltage dividing source electrode is electrically connected with a corresponding one of the first sub-pixel electrodes, wherein the voltage dividing drain electrode and the common electrode line are configured to be two electrodes of the voltage dropping storage capacitor.

12. The array substrate according to claim 11, wherein the pixel unit further includes a voltage dividing storage capacitor; and the voltage dividing drain electrode and the second sub-pixel electrode are configured to be two electrodes of the voltage dividing storage capacitor.

13. The array substrate according to claim 12, wherein projections of the voltage dividing storage capacitor and the voltage dropping storage capacitor on a same plane at least partially overlap with each other.

14. The array substrate according to claim 12, wherein in the pixel unit, one of the first sub-pixel electrodes and one of the second sub-pixel electrodes are positioned on both sides of the gate line, or one of the first sub-pixel electrodes and one of the second sub-pixel electrodes are positioned on both sides of the data line.

15. The array substrate according to claim 11, wherein in the pixel unit, one of the first sub-pixel electrodes and one of the second sub-pixel electrodes are positioned on both sides of the gate line, or one of the first sub-pixel electrodes and one of the second sub-pixel electrodes are positioned on both sides of the data line.

16. The array substrate according to claim 11, wherein the voltage dividing source electrode is not electrically connected with the corresponding second sub-pixel electrode.

17. The array substrate according to claim 11, wherein a portion of the voltage dividing drain electrode is overlapped with both the corresponding second sub-pixel electrode and the common electrode line, in a direction perpendicular to the array substrate.

* * * * *